United States Patent
Hayakawa et al.

(10) Patent No.: US 7,387,516 B2
(45) Date of Patent: Jun. 17, 2008

(54) ELECTRIC JUNCTION BOX

(75) Inventors: Tatsuya Hayakawa, Yokkaichi (JP); Tatsuya Oka, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 0 days.

(21) Appl. No.: 11/629,852

(22) PCT Filed: May 24, 2005

(86) PCT No.: PCT/JP2005/009406

§ 371 (c)(1),
(2), (4) Date: Dec. 18, 2006

(87) PCT Pub. No.: WO2006/006304

PCT Pub. Date: Jan. 19, 2006

(65) Prior Publication Data
US 2008/0038943 A1   Feb. 14, 2008

(30) Foreign Application Priority Data
Jul. 13, 2004   (JP) .............................. 2004-206211

(51) Int. Cl.
H01R 12/00   (2006.01)
(52) U.S. Cl. ................................... 439/76.2
(58) Field of Classification Search ............... 439/76.2, 439/74, 34, 76.1, 664, 606, 949, 701, 830, 439/65; 361/826, 852, 804, 752, 753, 644, 361/736, 730, 642; 174/50, 59, 53, 60, 57, 174/58, 17 R
See application file for complete search history.

(56) References Cited

U.S. PATENT DOCUMENTS

| | | | |
|---|---|---|---|
| 5,785,532 A | 7/1998 | Maue et al. | |
| 5,928,004 A * | 7/1999 | Sumida et al. | 439/76.2 |
| 6,257,901 B1 | 7/2001 | Torii | |
| 6,270,359 B1 * | 8/2001 | Kondo et al. | 439/76.2 |
| 6,283,769 B1 | 9/2001 | Asao et al. | |
| 6,514,091 B2 * | 2/2003 | Saito et al. | 439/76.2 |
| 2002/0022387 A1 | 2/2002 | Sumida | |
| 2002/0197893 A1 | 12/2002 | Hiroyuki et al. | |

FOREIGN PATENT DOCUMENTS

| | | |
|---|---|---|
| JP | A 6-104057 | 4/1994 |
| JP | A 2000-251984 | 9/2000 |
| JP | A 2000-324656 | 11/2000 |
| JP | A 2001-15952 | 1/2001 |
| JP | A 2001-128339 | 5/2001 |
| JP | A 2001-313132 | 11/2001 |
| JP | A 2002-58134 | 2/2002 |
| JP | A 2003-9347 | 1/2003 |

* cited by examiner

Primary Examiner—Edwin A. León
(74) Attorney, Agent, or Firm—Oliff & Berridge, PLC

(57) ABSTRACT

Three printed boards are stored in a case, and a relay connector for connecting the three printed boards is mounted on the second printed board at the middle position. The relay connector is provided with a first terminal storing part, which is long in a vertical direction, and a short second terminal storing part. The relay connector connects a terminal pin of the first printed board at an upper position with a terminal pin of the third printed board at a lower position, via a long first relay terminal stored in the first terminal storing part, while connecting a terminal pin of the first printed board and/or the terminal pin of the third printed board with a conductor of the second printed board, via a short second relay terminal stored in the second terminal storing part.

9 Claims, 10 Drawing Sheets

[Prior Art]

ELECTRIC JUNCTION BOX

TECHNICAL FIELD

The present invention relates to an electric junction box in which electric conductors of at least three circuit components accommodated in a casing are connected with one another through a relay connector.

BACKGROUND ART

Conventionally, a casing of an electric junction box mounted on a car body accommodates a laminate composed of bus bars formed by punching a conductive metal plate into a predetermined configuration and insulating plates layered on the bus bars alternately and circuit components consisting of an insulating substrate on which an electric conductor of a copper foil or the like is printed in a required pattern to form a printed-circuit board. When one casing accommodates a plurality of circuit components layered one upon another, electric conductors of the circuit components are connected with one another through a relay connector.

An electric junction box 1 of this kind accommodating the relay connector is provided, as disclosed in Japanese Patent Application Laid-Open No. 2001-15952 (patent document 1). As shown in FIG. 9, the electric junction box 1 has the laminate 2 of bus bars and the printed-circuit board 3. The housing (relay connector) 4 accommodating the relay terminal (not shown) is projected from the insulating plate of the bus bar laminate 2. The bus bars of the bus bar laminate 2 are connected with the relay terminal from below, and one end 5a of the connection terminal 5 is connected with the relay terminal from above. The other end 5b of the connection terminal 5 is soldered to the electric conductor of the printed-circuit board 3. Thereby the bus bars of the bus bar laminate 2 and the electric conductor of the printed-circuit board 3 are connected with each other.

But the number of circuits has increased owing to a rapid increase of electric and electronic parts in recent years. Thus in forming a required circuit from two circuit components, the circuit is necessarily horizontally large. The relay connector connecting the circuit components with each other is also necessarily large. Thereby the electric junction box is horizontally large.

In a construction in which three circuit components 6, 7, and 8 are accommodated in the casing of the electric junction box, with the circuit components 6, 7, and 8 vertically spaced at certain intervals, and the circuit components 6, 7, and 8 are connected with one another, it is possible to make the circuit components compact. But as shown in FIG. 10, it is necessary to form a housing 4 on the circuit component 7 located at an intermediate position and the circuit component 8 located at a lower position. Thus when the housing is formed on the circuit components 7 and 8, the interval between the circuit components is necessarily large. Therefore the electric junction box is very large in a vertical direction.

Patent document 1: Japanese Patent Application Laid-Open No.2001-15952

DISCLOSURE OF THE INVENTION

Problems to be Solved by the Invention

The present invention has been made in the above-described problems. It is an object of the present invention to divide an internal circuit of an electric junction box into at least three circuit components to thereby make each circuit component compact and connect electric conductors of the circuit components with one another with one relay connector to thereby decrease the interval between the circuit components and make the electric junction box compact.

Means for Solving the Problems

To achieve the above-described object, the present invention provides an electric junction box in which at least three circuit components consisting of first, second and third circuit components are accommodated in a casing with the first, second and third circuit components vertically spaced at certain intervals, and a relay connector is mounted on the second circuit component disposed at a position intermediate between the first and third circuit components;

a housing of the relay connector is stepped in a vertical direction thereof and has a part in which vertically long first terminal accommodating portions are formed and a part in which vertically short second terminal-accommodating portions are formed;

each of the first terminal-accommodating portions accommodates a long first relay terminal, and each of the second terminal-accommodating portions accommodates a short second relay terminal;

a terminal conductive with an electric conductor of the first circuit component and a terminal conductive with an electric conductor of the third circuit component are inserted from above and below into the first relay terminal to connect the terminals of the first and third circuit component with each other through the first relay terminal;

the second relay terminal is connected with an electric conductor of the second circuit component, and the terminal conductive with the electric conductor of the first circuit component or with the electric conductor of the third circuit component is inserted into the second relay terminal to connect the electric conductor of the first circuit component or the electric conductor of the third circuit component with the electric conductor of the second circuit component through the second relay terminal.

According to the above-described construction, the vertically long first terminal accommodating portion and the vertically short second terminal-accommodating portion are formed in penetration through the relay connector. Through the long first relay terminal accommodated in the first terminal-accommodating portion, it is possible to electrically connect the terminal electrically conductive with the electric conductor of the upward disposed first circuit component with the terminal electrically conductive with the electric conductor of the downward disposed third circuit component. Further through the short second relay terminal connected with the second circuit component and accommodated in the second terminal-accommodating portion, it is possible to electrically connect the electric conductor of the second circuit component with the terminal conductive with the electric conductor of the first circuit component and the terminal conductive with the electric conductor of the third circuit component.

As described above, because the internal circuits of the electric junction box are divided into at least three circuit components, each circuit component can be made compact. Further because the electric conductors of the three circuit components can be connected with one another through one relay connector, it is possible to decrease the interval between circuit components and thereby make the electric junction box compact.

At both sides of the first relay terminal in a longitudinal direction thereof, the first relay terminal has female-female terminal fit-in portions into which the connection terminals are inserted and has a connection piece, projected sideways, which is connected with an electric conductor disposed at an intermediate position to connect the electric conductors of the first, second, and third circuit components with one another through the first relay terminal.

The vertically longer part in which the first terminal-accommodating portions of the relay connector are formed in parallel widthwise is fitted in an opening formed on a substrate of the second circuit component; and the vertically shorter part in which the second terminal-accommodating portions are formed in parallel widthwise is mounted on the substrate of the second circuit component.

According to the above-described construction, the longer part in which the first terminal-accommodating portions of the relay connector are formed in parallel widthwise is fitted in the opening of the second circuit component, with the longer part projected upward and downward from the second circuit component. Thus it does not occur that the interval between the first circuit component and the second circuit component or the interval between the second circuit component and the third circuit component becomes too large.

Further because the shorter part in which the second terminal-accommodating portions are formed in parallel widthwise is mounted on the substrate of the second circuit component, the relay connector can be mounted on the substrate of the second circuit component in a stable state.

The first terminal-accommodating portions and the second terminal-accommodating portions of the relay connector are arranged in a plurality of rows in parallel, with the terminal-accommodating portions of each row being set equally to each other in vertical lengths thereof and with the terminal-accommodating portions of one row being set differently from the terminal-accommodating portions of other row in vertical lengths thereof, whereby the row forming the first terminal-accommodating portion and the row forming the second terminal-accommodating portion are vertically stepped from each other.

According to the above-described construction, because the terminal-accommodating portions are arranged in a plurality of rows in parallel, the relay connector is prevented from becoming too large in its longitudinal direction and thereby can be made compact.

It is possible to adopt a construction in which the relay connector is stepped by disposing the first terminal-accommodating portions thereof and the second terminal-accommodating portions thereof in the same row.

By selectively accommodating the relay connector in which the terminal-accommodating portions are arranged in a plurality of rows in parallel and the relay connector in which the terminal-accommodating portions are arranged in a plurality of rows in series in dependence on an accommodation space, it is possible to dispose the relay connector most suitably.

It is preferable that the first, second, and third circuit components consist of a printed-circuit board respectively; each of the terminals connected with the first and second relay terminals consists of a terminal pin connected with electric conductors of the printed-circuit boards; and a substrate-mounting relay is mounted on the printed-circuit board of the first and third circuit components at a position thereof confronting the second terminal-accommodating portions of the relay connector.

The longer part in which the first terminal-accommodating portions of the relay connector are formed in parallel widthwise is projected from the shorter part in which the second terminal-accommodating portions are formed. Thus a vacant space is formed between the shorter part and the printed-circuit board toward which the longer part is projected. In this construction, because the relay to be mounted on the printed-circuit board is disposed in the vacant space, it is possible to make the electric junction box compact by effectively utilizing the vacant space.

It is possible to adopt a construction in which a bus bar is accommodated at an upper portion of the first circuit component or a lower portion of the third circuit component; the bus bar is connected with the electric conductor of the first and second circuit components or/and the electric conductor of the third circuit component directly or through the first and second relay terminals.

Effect of the Invention

As described above, according to the present invention, the vertically long first terminal-accommodating portions and the vertically short second terminal-accommodating portions are formed in penetration through the relay connector connecting the three circuit components accommodated inside the casing of the electric junction box with one another. Through the first relay terminal accommodated in the first terminal-accommodating portion, it is possible to electrically connect the terminal electrically conductive with the electric conductor of the upward disposed first circuit component with the terminal electrically conductive with the electric conductor of the downward disposed third circuit component. Further through the short second relay terminal accommodated in the second terminal-accommodating portion, it is possible to electrically connect the electric conductor of the second circuit component with the terminal conductive with the electric conductor of the first circuit component or/and the terminal conductive with the electric conductor of the third circuit component.

As described above, because the internal circuits of the electric junction box are divided into at least three circuit components, each circuit component can be made compact. Further because the electric conductors of the three circuit components can be connected with one another through one relay connector, it is possible to decrease the interval between circuit components and thereby make the electric junction box compact.

Figure 1:
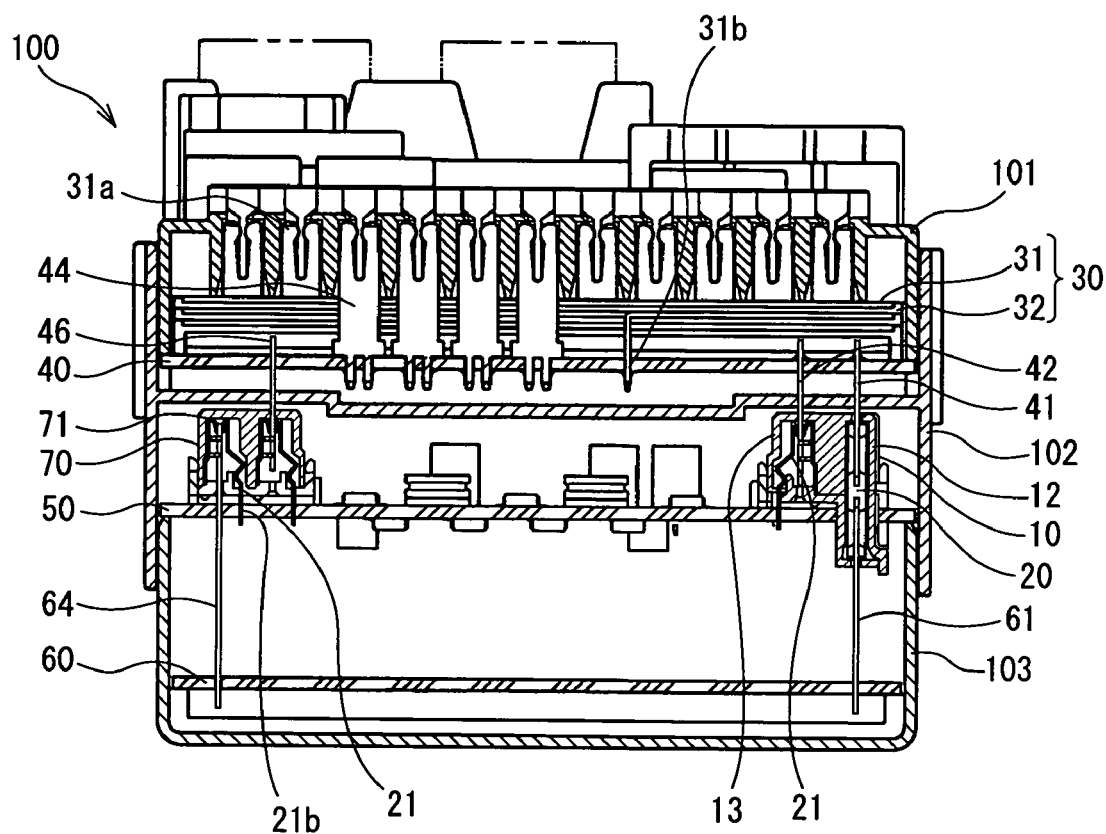
FIG. 1 is a sectional view of an electric junction box of a first embodiment of the present invention.

EXPLANATIONS OF REFERENCE NUMERALS
AND SYMBOLS

10: relay connector
12: longer part
13: shorter part
14: first terminal-accommodating portion
15: second terminal-accommodating portion
20: first relay terminal
21: second relay terminal
30: laminate
40: first printed-circuit board
41, 42, 61, 62: terminal pin
50: second printed-circuit board
60: third printed-circuit board
100: electric junction box
101: upper case
102: intermediate case
103: lower case

BEST MODE FOR CARRYING OUT THE
INVENTION

The embodiment of the present invention is described with reference to the drawings.

Figure 2:
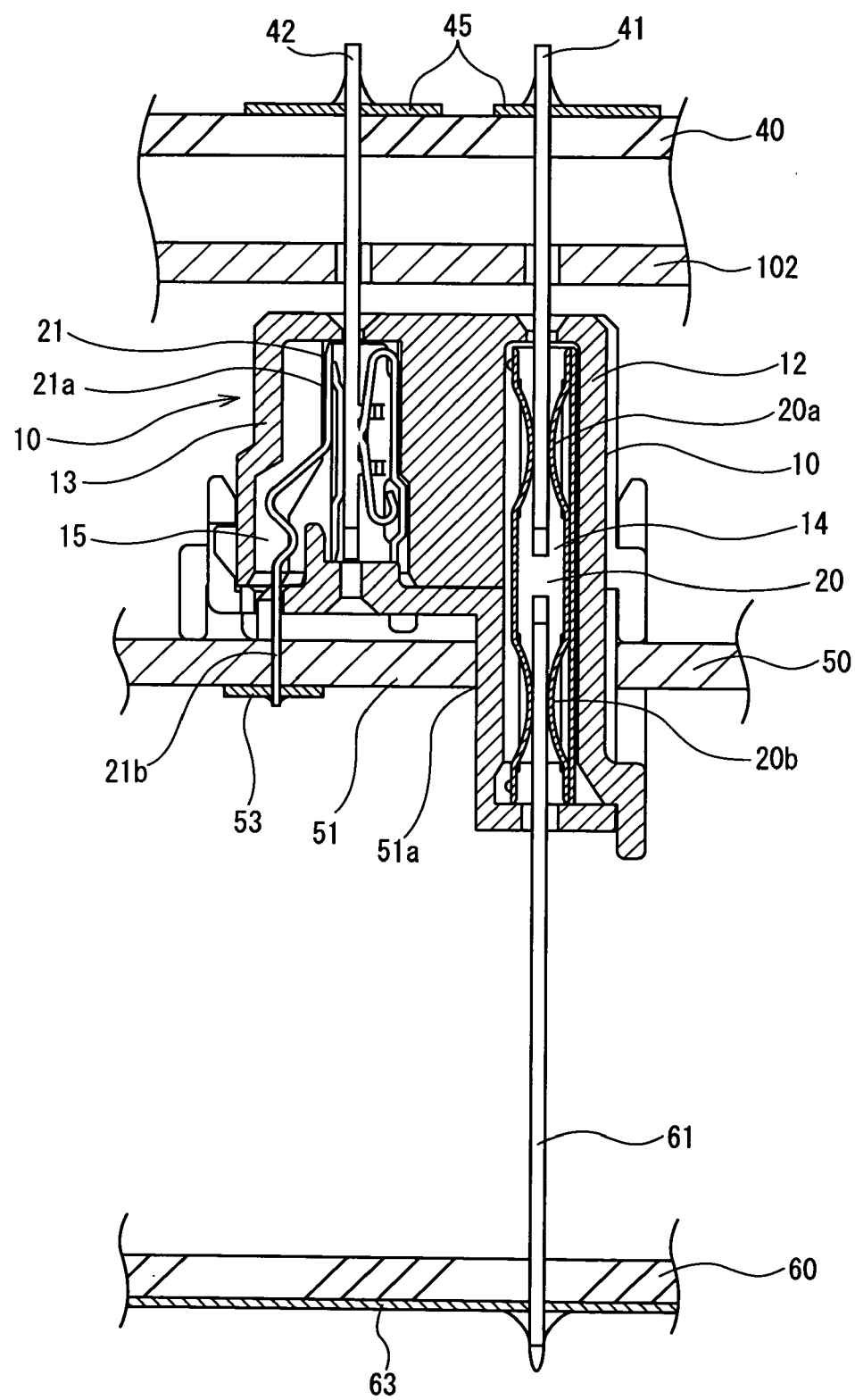
FIG. 2 is a main portion-enlarged view showing a state in which electric conductors of first through third printed-circuit boards are connected with one another.
Figure 3:
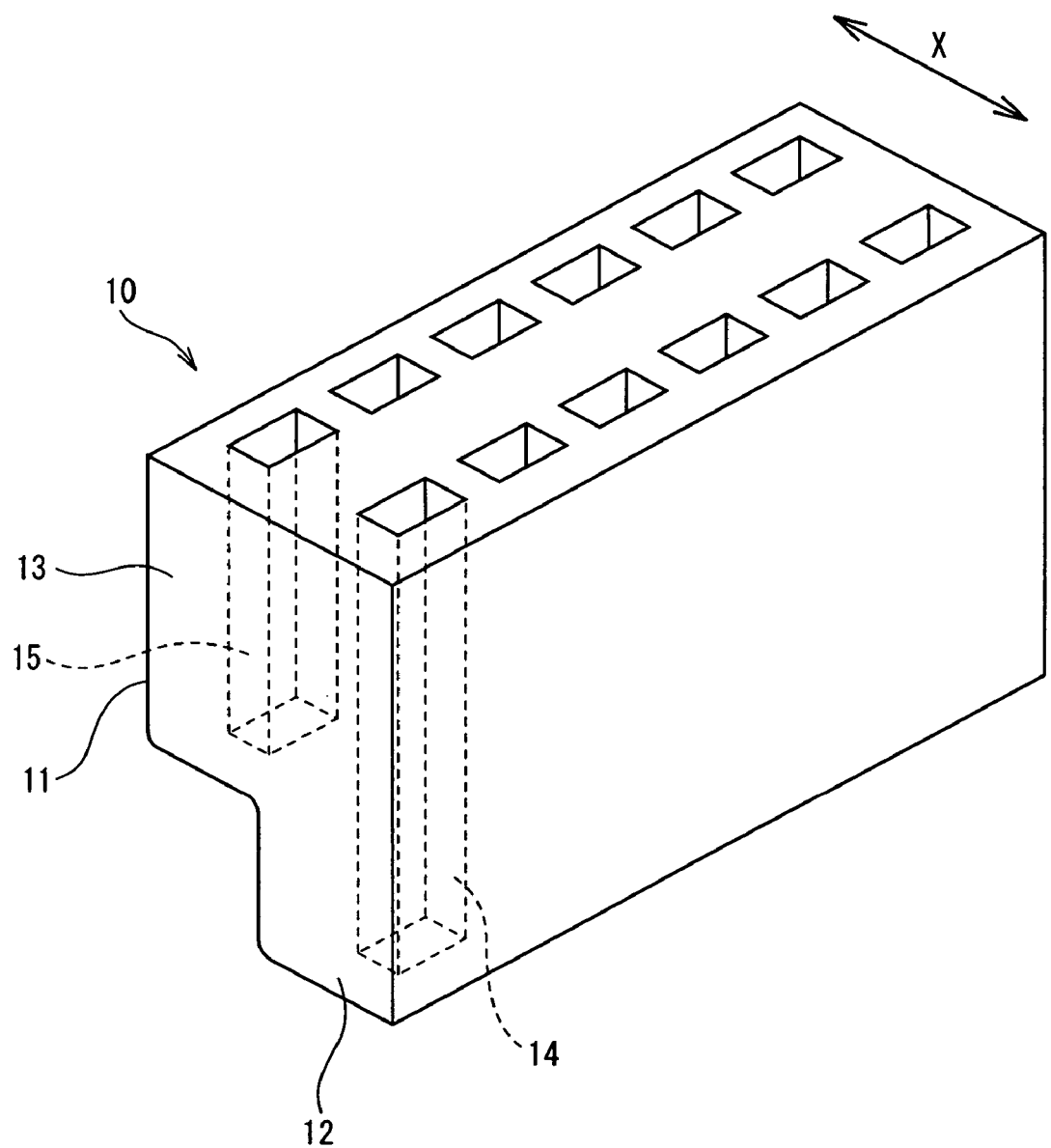
FIG. 3 is a perspective view of a relay connector of the first embodiment.

FIGS. 1 through 3 show a first embodiment of the present invention. A casing, of an electric junction box 100, composed of an upper case 101, an intermediate case 102, and a lower case 103 combined with each other accommodates a laminate 30 composed of bus bars 31 layered alternately with insulating plates 32 and three printed-circuit boards 40, 50, and 60 vertically spaced at certain intervals, with electric conductors of the three printed-circuit boards 40, 50, and 60 connected to each other with a relay connector 10.

In detail, the laminate 30 and the first printed-circuit board 40 are accommodated in a space surrounded with the upper case 101 and the intermediate case 102, with the laminate 30 vertically layered on the first printed-circuit board 40. The second printed-circuit board 50 and the third printed-circuit board 60 are accommodated in a spaced surrounded with the intermediate case 102 and the lower case 103, with the second printed-circuit board 50 and the third printed-circuit board 60 vertically spaced at a certain interval.

As shown in FIGS. 2 and 3, in the relay connector 10, a lower surface of a housing 11 is vertically stepped in a front-to-back direction X. One side (front side in FIG. 3) of the housing 11 is formed as a longer part 12 vertically long, whereas the other side (back side in FIG. 3) thereof is formed as a shorter part 13 vertically short. The upper surface of the housing 11 is entirely on the same level.

At the longer part 12, first terminal-accommodating portions 14 vertically long and vertically penetrating through the housing 11 are arranged in a row widthwise. At the shorter part 13, second terminal-accommodating portions 15 vertically short and vertically penetrating through the housing 11 are arranged in a row widthwise. The first terminal-accommodating portions 14 and the second terminal-accommodating portions 15 are respectively arranged widthwise. Each of the first terminal-accommodating portions 14 of the longer part 12 accommodates a long first relay terminal 20 having female terminal fit-in portions 20a, 20b disposed at both ends thereof. Each of the second terminal-accommodating portion 15 of the shorter part 13 accommodates a short second relay terminal 21 having one female terminal fit-in portion 21a and a connection piece 21b projected sideways.

The relay connector 10 is disposed along a one-side periphery of the second printed-circuit board 50 disposed at an intermediate position in the three printed-circuit boards 40, 50, and 60. An opening 51a is formed on an insulating substrate 51 of the second printed-circuit board 50. A lower side of the longer part 12 of the relay connector 10 is passed through the opening 51a, while a lower surface of the shorter part 13 is placed on an upper surface of the insulating substrate 51, with the relay connector 10 bolted (not shown) to the insulating substrate 51 of the second printed-circuit board 50.

As shown in FIG. 2, the connection piece 21b of the second relay terminal 21 accommodated in the second terminal-accommodating portion 15 of the shorter part 13 is projected from a lower end of the relay connector 10, with the connection piece 21b in penetration through the insulating substrate 51 of the second printed-circuit board 50 and connected with an electric conductor 53 of the second printed-circuit board 50 by soldering.

A terminal pin 41 soldered to an electric conductor 45 of the first printed-circuit board 40 is inserted into the first terminal-accommodating portion 14 of the longer part 12 of the relay connector 10 from above and connected with the female terminal fit-in portion 20a of the first relay terminal 20. A terminal pin 61 soldered to an electric conductor 63 of the third printed-circuit board 60 is inserted into the first terminal-accommodating portion 14 from below and connected with the female terminal fit-in portion 20b of the first relay terminal 20. Thereby the terminal pins 41 and 61 are connected with each other through the first relay terminal 20.

A terminal pin 42 soldered to the electric conductor 45 of the first printed-circuit board 40 is inserted into the second terminal-accommodating portion 15 of the shorter part 13 of the relay connector 10 from above or a terminal pin (not shown) connected with the electric conductor 63 of the third printed-circuit board 60 is inserted into the second terminal-accommodating portion 15 from below. The terminal pin 42 or the unshown terminal pin is connected with the female terminal fit-in portion 21a of the second relay terminal 21. These terminal pins are connected with the electric conductor 53 of the second printed-circuit board 50 through the second relay terminal 21.

As shown in FIG. 1, a relay connector 70 having only vertically short terminal-accommodating portions 71 formed therein is disposed on the periphery of the second printed-circuit board 50 at the other side thereof. The terminal-accommodating portions 71 are arranged widthwise in parallel. The terminal-accommodating portion 71 accommodates the second relay terminal 21 similar to that accommodated in the second terminal-accommodating portion 15 of the shorter part 13 of the relay connector 10. The connection piece 21b of the second relay terminal 21 is connected with the electric conductor 53 of the second printed-circuit board 50 by soldering. A terminal pin 46 soldered to the electric conductor 45 of the first printed-circuit board 40 is inserted into the terminal-accommodating portion 71 disposed in one row (right-hand side in FIG. 1) from above to connect the electric conductor 45 of the first printed-circuit board 40 and the electric conductor 53 of the second printed-circuit board 50 with each other. A terminal pin 64 soldered to the electric conductor 63 of the third printed-circuit board 60 is inserted into the terminal-accommodating portion 71 disposed in the other row (right-hand side in FIG. 1) from below to connect the electric conductor 63 of the third printed-circuit board 60 and the electric conductor 53 of the second printed-circuit board 50 with each other.

A pressure welding tab 44 connected with the electric conductor 45 of the first printed-circuit board 40 by soldering and a pressure welding tab 31a formed by upward bending the bus bars 31 of the laminate 30 are projected into a fuse-accommodating portion 104 to connect the pressure welding tabs 44 and 31a with each other through a fuse (not shown) and connect the electric conductor 45 of the first printed-circuit board 40 and the bus bars 31 of the laminate 30 with each other.

A tab 31b formed by downward bending a part of the bus bars 31 of the laminate 30 is directly connected with the electric conductor 45 of the first printed-circuit board 40 by soldering.

The tab 31b formed by bending the bus bar 31 may be extended further downward and directly soldered to the electric conductor 53 of the second printed-circuit board 50 or to the electric conductor 63 of the third printed-circuit board 60 or may be inserted into the first and second terminal-accommodating portion 14, 15 of the relay connector 10 and connected with the electric conductor 53 of the second printed-circuit board 50 or with the electric conductor 63 of the third printed-circuit board 60 through the first and second relay terminals 20, 21.

According to the above-described construction, the vertically long first terminal-accommodating portion 14 and the vertically short second terminal-accommodating portion 15 are formed in penetration through the relay connector 10 connecting the three printed-circuit boards 40, 50, and 60 accommodated in the casing of the electric junction box 100. Through the first relay terminal 20 accommodated in the first terminal-accommodating portion 14, it is possible to electrically connect the electric conductor 45 of the upward disposed first printed-circuit board 40 with the electric conductor 63 of the downward disposed third printed-circuit board 60. Further through the second relay terminal 21 accommodated in the second terminal-accommodating portion 15, it is possible to electrically connect the electric conductor 53 of the second printed-circuit board 50 with the electric conductor 45 of the first printed-circuit board 40 or/and the electric conductor 63 of the third printed-circuit board 60. In this manner, the three printed-circuit boards 40, 50, and 60 can be connected with one another through the relay connector 10.

As described above, because the internal circuits of the electric junction box 100 are divided into the laminate 30 and the three printed-circuit boards 40, 50, and 60, each circuit component can be made compact. Further because the electric conductors 45, 53, and 63 of the three printed-circuit boards 40, 50, and 60 can be connected with one another through one relay connector, it is possible to decrease the interval between the printed-circuit boards 40 and 50 and the interval between the printed-circuit boards 50 and 60. Thereby it is possible to make the electric junction box 100 compact.

Further because the first terminal-accommodating portions 14 and the second terminal-accommodating portions 15 are arranged in parallel widthwise respectively, it is possible to make the relay connector 10 compact without increasing it in its longitudinal direction.

In the first embodiment, the first terminal-accommodating portions and the second terminal-accommodating portions are formed in one row respectively. But the first terminal-accommodating portions and the second terminal-accommodating portions may be formed in two or more rows respectively. Furthermore the first terminal-accommodating portions and the second terminal-accommodating portions may be mixedly formed.

Figure 4:
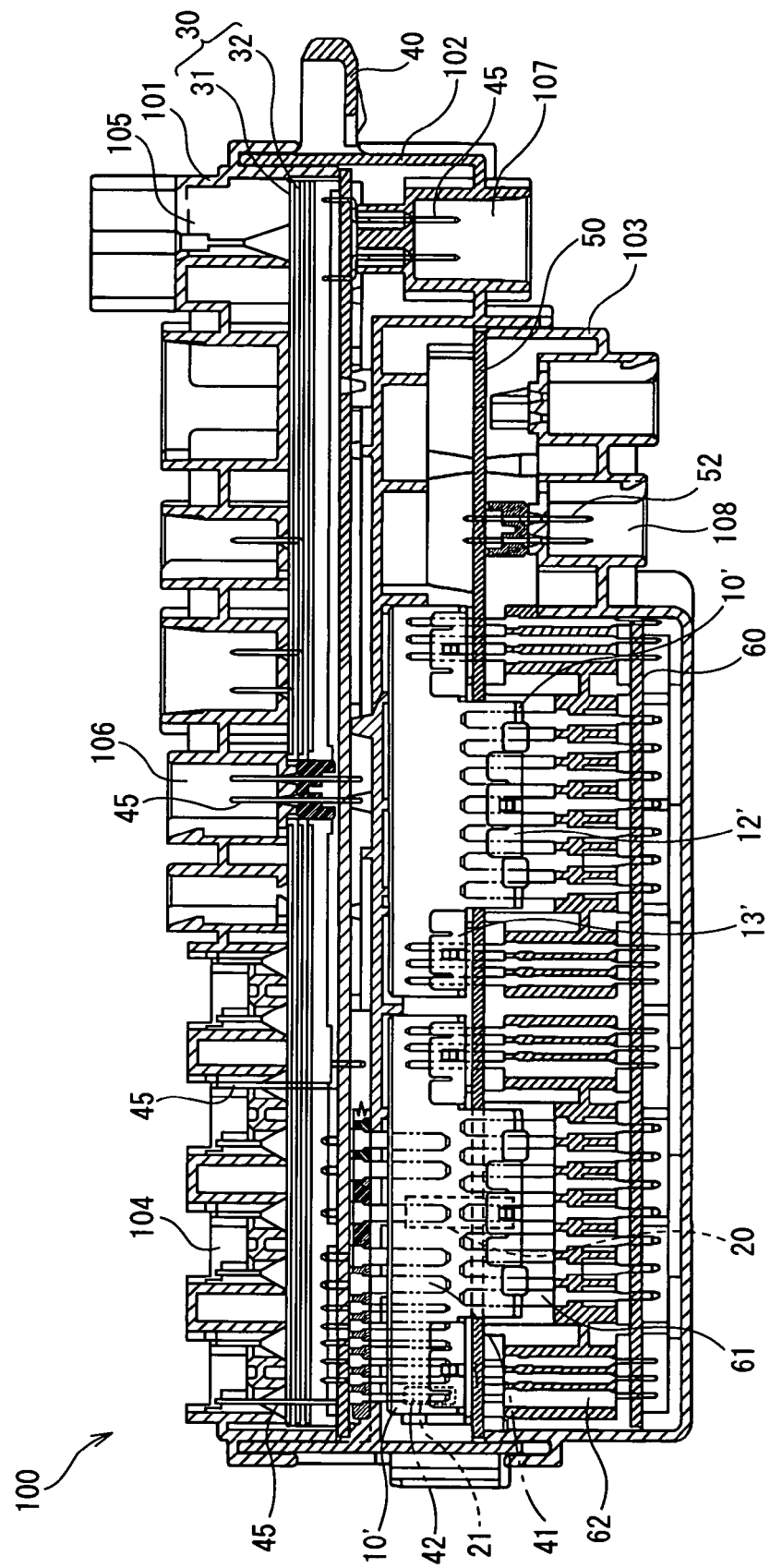
FIG. 4 is a sectional view of an electric junction box of a second embodiment of the present invention.
Figure 5A:
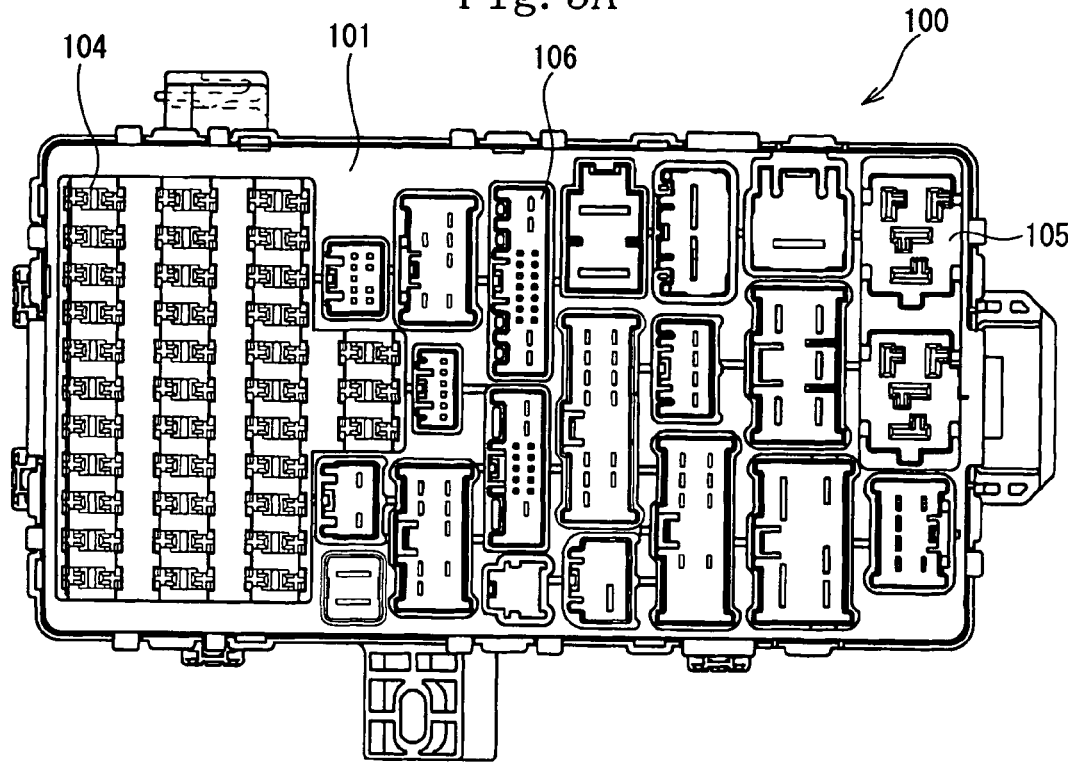
FIG. 5 shows the electric junction box, in which (A) is a plan view, and (B) is a bottom view.
Figure 5B:
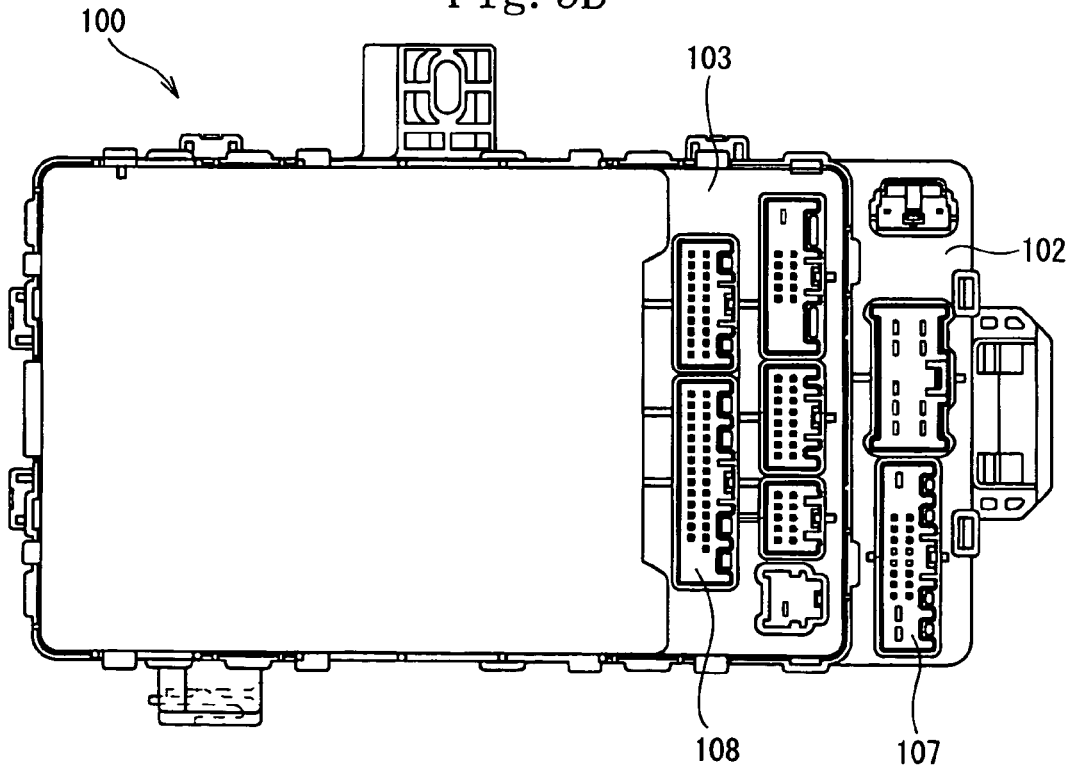
Figure 6A:
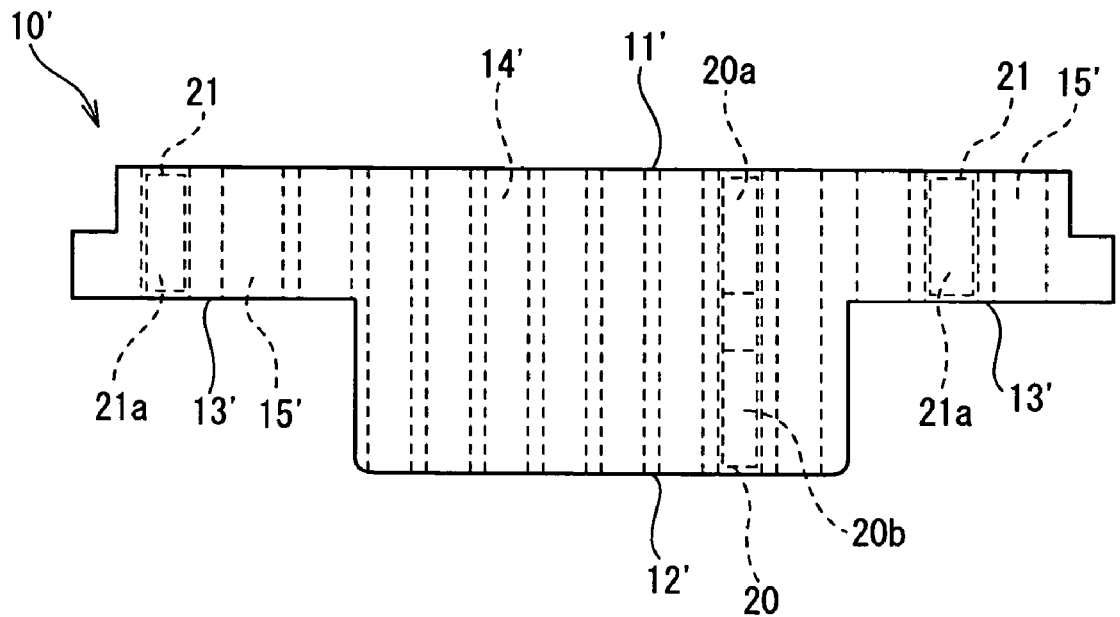
FIG. 6 shows a relay connector of the second embodiment, in which (A) is a front view, and (B) is a side view.
Figure 6B:
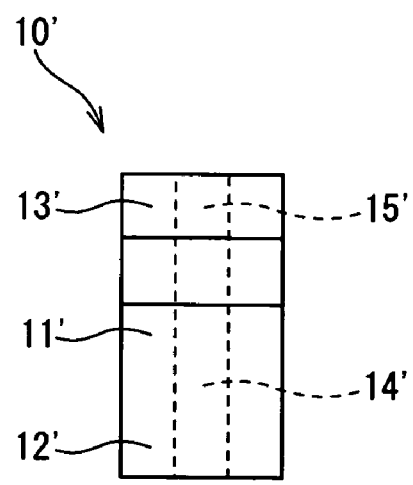

FIGS. 4 through 6 show the second embodiment of the present invention.

In the second embodiment, the configuration of a relay connector 10' connecting three printed-circuit boards with one another is different from that of the relay connector of the first embodiment.

As shown in FIG. 6(A), in the relay connector 10' of the second embodiment, a longer part 12' vertically long is formed at a central portion of a long housing 11'. A shorter part 13' vertically short is formed at both sides of the longer part 12' so that the relay connector 10' has a stepped configuration. The upper surface of the housing 11' is entirely on the same level. The position of the housing 11' is not limited to the central portion thereof in the longitudinal direction thereof.

The longer part 12' and the shorter part 13' have first and second terminal-accommodating portions 14', 15' vertically penetrating through the longer part 12' and the shorter part 13' respectively. The first and second terminal-accommodating portions 14', 15' accommodate the first relay terminal 20 and the second relay terminal 21, similar to those of the first embodiment, therein respectively.

Similarly to the first embodiment, the terminal pin 41 soldered to the electric conductor 45 of the first printed-circuit board 40 is inserted into the first terminal-accommodating portion 14' of the longer part 12' of the relay connector 10' from above through a through-hole (not shown) of the intermediate case 102 and connected with the female terminal fit-in portion 20a of the first relay terminal 20. The terminal pin 61 soldered to the electric conductor 63 of the third printed-circuit board 60 is inserted into the first terminal-accommodating portion 14' from below and connected with the female terminal fit-in portion 20b of the first relay terminal 20. Thereby the terminal pins 41 and 61 are connected with each other through the first relay terminal 20.

The terminal pin 42 soldered to the electric conductor 45 of the first printed-circuit board 40 is inserted into the second terminal-accommodating portion 15' of the relay connector 10' from above or a terminal pin 62 connected with the electric conductor 63 of the third printed-circuit board 60 is inserted into the second terminal-accommodating portion 15' from below. The terminal pin 42 or 62 is connected with the female terminal fit-in portion 21a of the second relay terminal 21 and is connected with the electric conductor 53 of the second printed-circuit board 50 through the second relay terminal 21.

Of the terminal pins connected with the electric conductor 45 of the first printed-circuit board 40, terminal pins 45 not connected with the relay connector 10' are respectively projected into the fuse-accommodating portion 104, a relay accommodating portion 105, and a connector-accommodating portion 106 formed on the upper case 101 or a connector-accommodating portion 107 formed on the intermediate case 102 and respectively connected with external circuits connected with fuses, relays or connectors respectively.

A terminal pin 52 is connected with the electric conductor 53 of the second printed-circuit board 50 by soldering. The terminal pin 52 is projected into a connector-accommodating portion 108 formed on the lower case 103 and connected with an external circuit.

The three printed-circuit boards 40, 50, and 60 can be connected with one another through the relay connector 10' having the above-described construction.

Figure 7A:
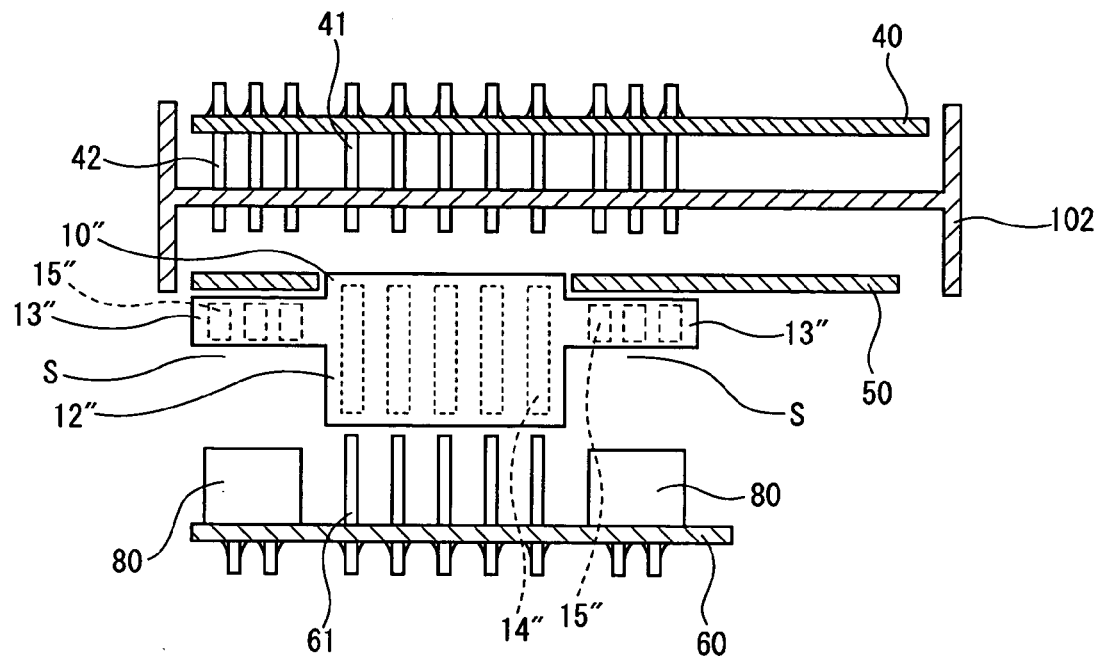
FIGS. 7 (A) and (B) show a third embodiment of the present invention.
Figure 7B:
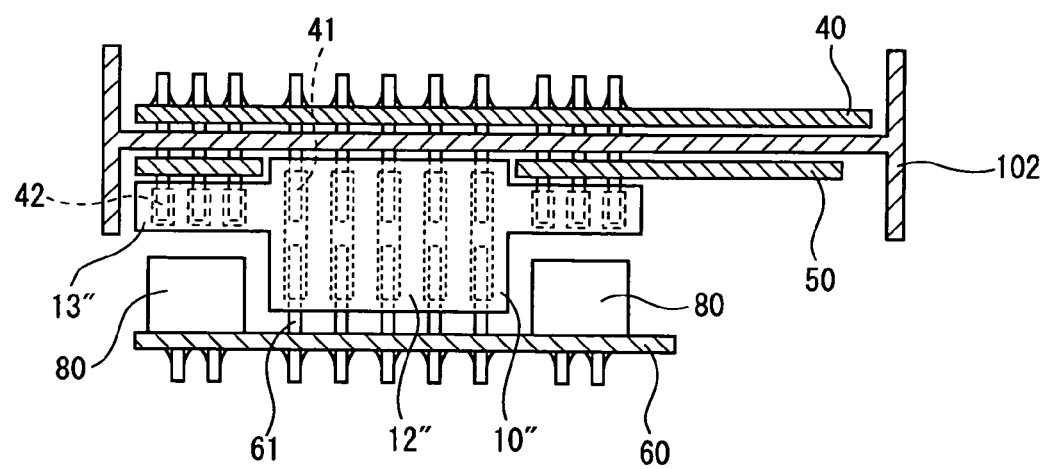

FIG. 7 shows the third embodiment of the present invention.

In the third embodiment, a longer part 12" of a relay connector 10" is projected toward the third printed-circuit board 60, with a space S formed between a shorter part 13" of the relay connector 10" and the third printed-circuit board 60. A substrate-mounting relay 80 is mounted at a position, of the third printed-circuit board 60, which confronts the shorter part 13" (second terminal-accommodating portion 15") in such a way that when each circuit component is installed, the substrate-mounting relay 80 is disposed in the space S.

Terminal pins 42 connected with the electric conductor of the first printed-circuit board 40 are downward inserted into the second terminal-accommodating portion 15" of the relay connector 10" disposed at the position confronting the substrate-mounting relay 80. Therefore the relay 80 does not interfere with tabs in a tab insertion operation.

According to the above-described construction, because the substrate-mounting relay 80 is disposed in the space S formed between the shorter part 13" (second terminal-accommodating portion 15") of the relay connector 10" and the third printed-circuit board 60, the electric junction box can be made compact by effectively utilizing the vacant space.

The longer part of the relay connector may be projected above the shorter part, and the substrate-mounting relay may be mounted at a position which is disposed below the first printed-circuit board and confronts the shorter part (second terminal-accommodating portion). In this case, a terminal conductive with an electric conductor of the third printed-circuit board is inserted into the second terminal-accommodating portion from below.

Figure 8:
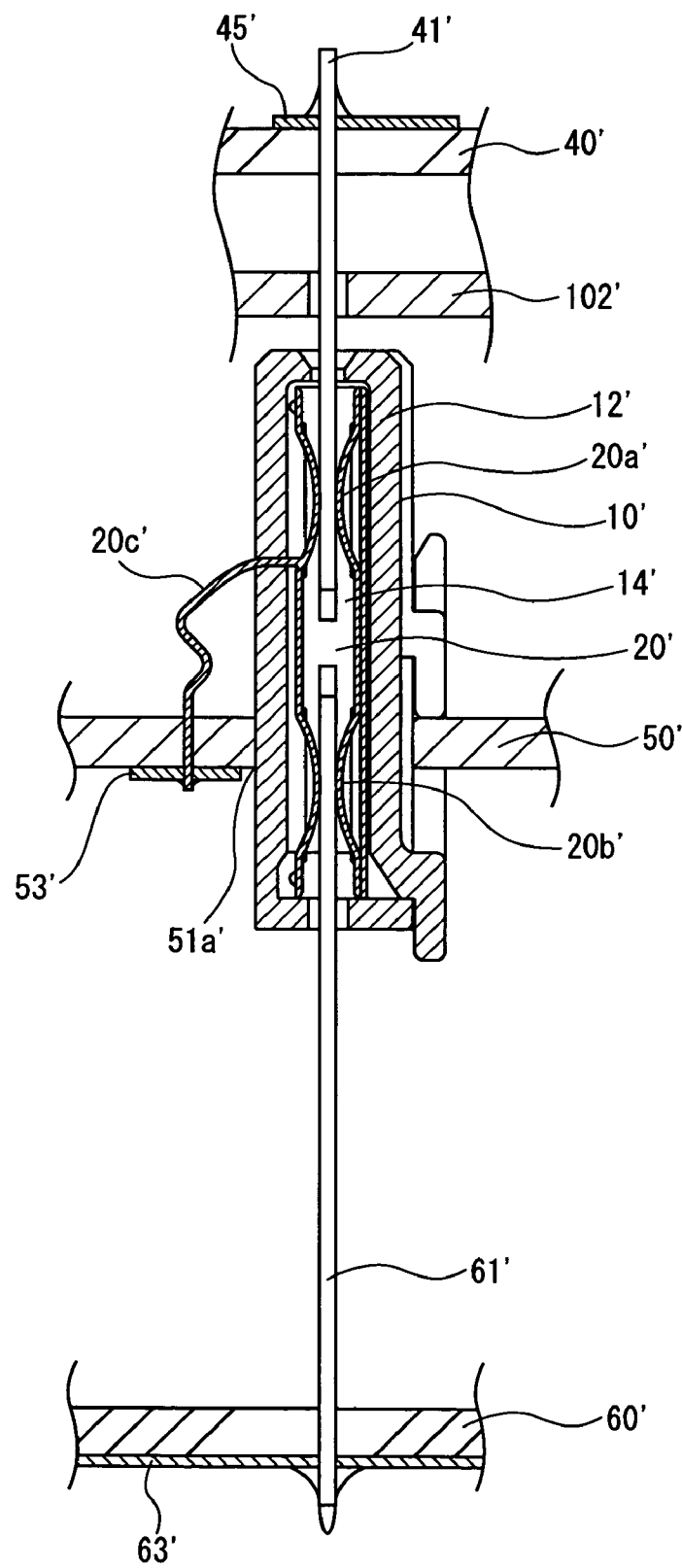
FIG. 8 shows a fourth embodiment of the present invention
Figure 9:
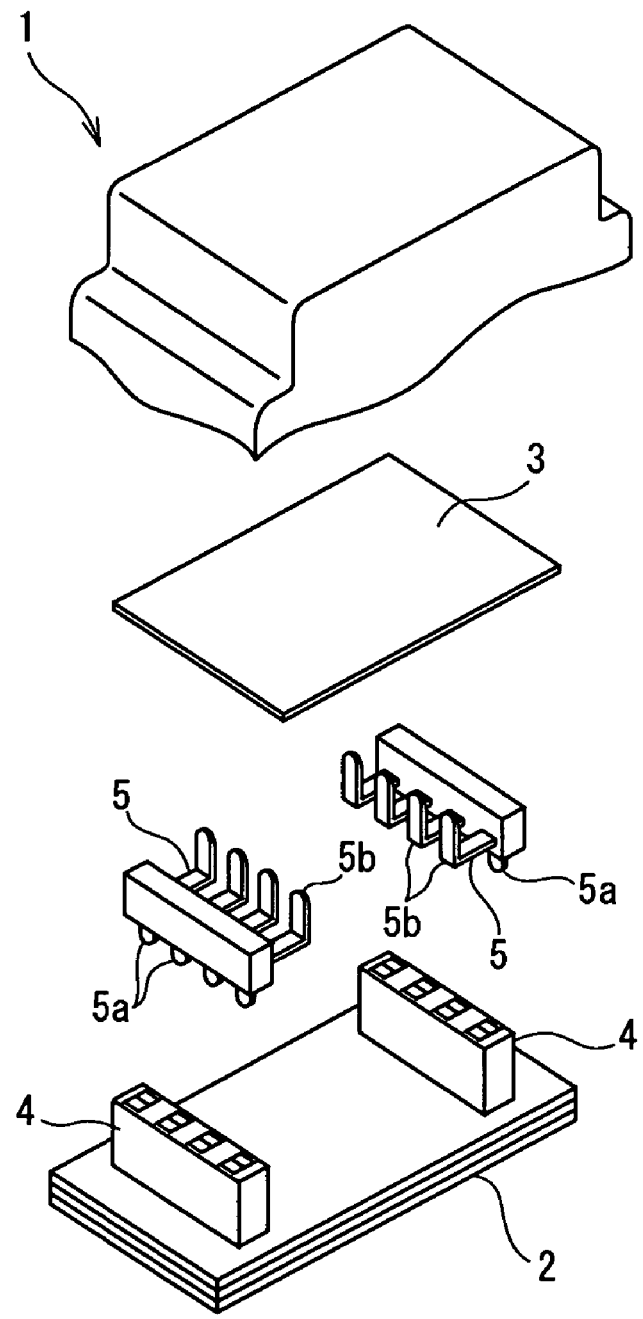
FIG. 9 shows a conventional art.
Figure 10:
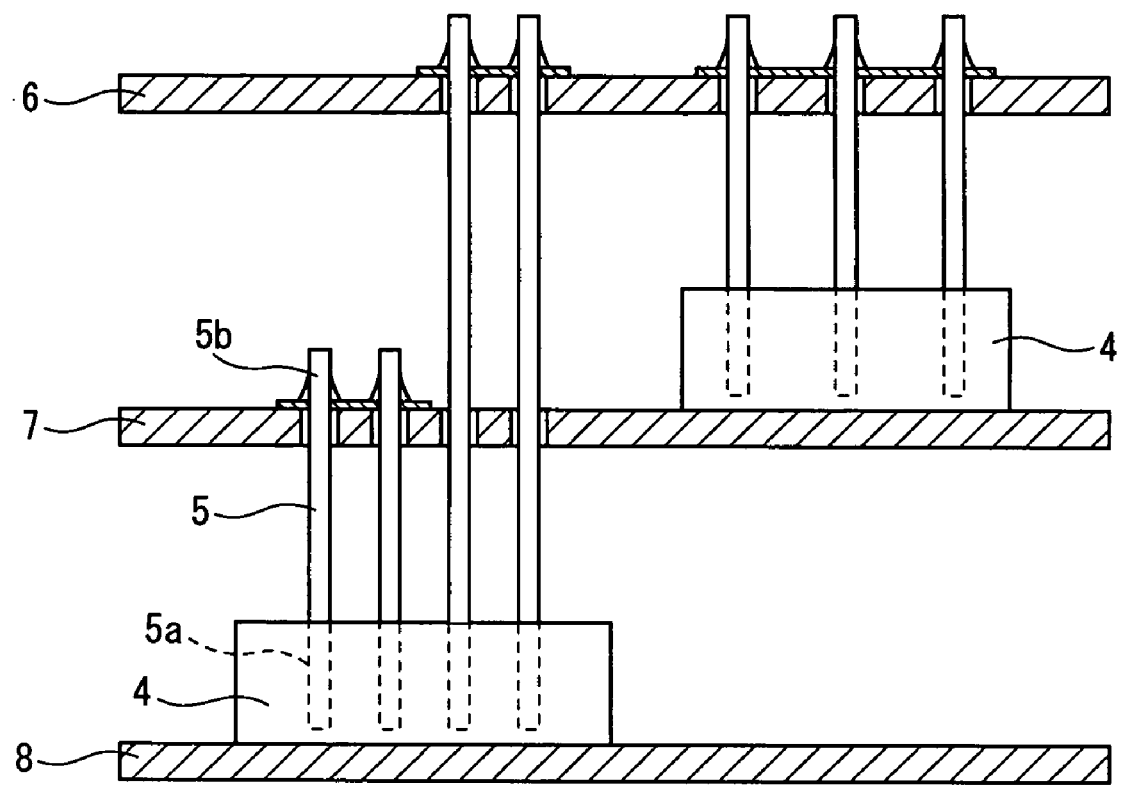
FIG. 10 shows conventional problems.

FIG. 8 shows the fourth embodiment.

In the fourth embodiment, the configuration of a first relay terminal 20' accommodated in the first terminal-accommodating portion 14' is different from that of the first relay terminal of the above-described embodiments. That is, a connection piece 20c' similar to the connection piece of the second relay terminal is formed on the long first relay terminal 20' and connected with an electric conductor 53' of a second printed-circuit board 50' to electrically connect electric conductors 45', 53', and 63' of the first through third printed-circuit boards 40', 50', and 60' with one another.

What is claimed is:

1. An electric junction box in which at least three circuit components consisting of first, second and third circuit components are accommodated in a casing with said first, second and third circuit components vertically spaced at certain intervals, and a relay connector is mounted on said second circuit component disposed at a position intermediate between said first and third circuit components;

a housing of said relay connector is stepped in a vertical direction thereof and has a part in which vertically long first terminal-accommodating portions are formed and a part in which vertically short second terminal-accommodating portions are formed;

each of said first terminal-accommodating portions accommodates a long first relay terminal, and each of said second terminal-accommodating portions accommodates a short second relay terminal;

a terminal conductive with an electric conductor of said first circuit component and a terminal conductive with an electric conductor of said third circuit component are inserted from above and below into said first relay terminal to connect said terminals of said first and third circuit component with each other through said first relay terminal; and said second relay terminal is connected with an electric conductor of said second circuit component, and a terminal conductive with an electric conductor of said first circuit component or with an electric conductor of said third circuit component is inserted into said second relay terminal to connect an electric conductor of said first circuit component or an electric conductor of said third circuit component with said electric conductor of said second circuit component through said second relay terminal.

2. The electric junction box according to claim 1, wherein said vertically longer part in which said first terminal-accommodating portions of said relay connector are formed in parallel widthwise is fitted in an opening formed on a substrate of said second circuit component; and said vertically shorter part in which said second terminal-accommodating portions are formed in parallel widthwise is mounted on said substrate of said second circuit component.

3. The electric junction box according to claim 1, wherein said first terminal-accommodating portions and said second terminal-accommodating portions are disposed in a plurality of rows in parallel in said housing of said relay connector, with said terminal-accommodating portions of each row being set equally to each other in vertical lengths thereof and with said terminal-accommodating portions of one row being set differently from said terminal-accommodating portions of other row in vertical lengths thereof, whereby said row forming said first terminal-accommodating portion and said row forming said second terminal-accommodating portion to vertically stepped from each other.

4. The electric junction box according to claim 1, wherein said first terminal-accommodating portions of said relay connector and said second terminal-accommodating portions thereof are disposed in the same row which is vertically stepped.

5. The electric junction box according to claim 1, wherein at both sides of said first relay terminal in a longitudinal direction thereof, said first relay terminal has female-female terminal fit-in portions into which said terminal conductive with said electric conductor of said first circuit component and said terminal conductive with said electric conductor of said third circuit component are inserted and has a connection piece, projected sideways, which is connected with said electric conductor of said second circuit component to connect said electric conductors of said first, second, and third circuit components with one another through said first relay terminal.

6. The electric junction box according to claim 5, wherein said vertically longer part in which said first terminal-accommodating portions of said relay connector are formed in parallel widthwise is fitted in an opening formed on a substrate of said second circuit component; and said vertically shorter part in which said second terminal-accommodating portions are formed in parallel widthwise is mounted on said substrate of said second circuit component.

7. The electric junction box according to claim 5, wherein said first terminal-accommodating portions and said second terminal-accommodating portions are disposed in a plurality of rows in parallel in said housing of said relay connector, with said terminal-accommodating portions of each row being set equally to each other in vertical lengths thereof and with said terminal-accommodating portions of one row being set differently from said terminal-accommodating portions of other row in vertical lengths thereof, whereby said row forming said first terminal-accommodating portion and said row forming said second terminal-accommodating portion to vertically stepped from each other.

8. The electric junction box according to claim 1, wherein said first, second, and third circuit components consist of a printed-circuit board respectively; each of said terminals connected with said first and second relay terminals consists of a terminal pin connected with electric conductors of said printed-circuit boards; and a substrate-mounting relay is mounted on said printed-circuit board of said first or/and third circuit components at a position thereof confronting said second terminal-accommodating portions of said relay connector.

9. The electric junction box according to claim 8, wherein a bus bar is accommodated at an upper portion of said first circuit component or a lower portion of said third circuit component; said bus bar is connected with said electric conductor of said first and second circuit components or/and said electric conductor of said third circuit component directly or through said first and second relay terminals.

* * * * *